United States Patent
Yu et al.

(10) Patent No.: US 9,349,712 B2
(45) Date of Patent: May 24, 2016

(54) DOUBLED SUBSTRATE MULTI-JUNCTION LIGHT EMITTING DIODE ARRAY STRUCTURE

(71) Applicant: TSMC Solid State Lighting Ltd., Hsinchu (TW)

(72) Inventors: Chih-Kuang Yu, Chiayi (TW); Chyi Shyuan Chern, Taipei (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/626,968

(22) Filed: Feb. 20, 2015

(65) Prior Publication Data

US 2015/0162315 A1    Jun. 11, 2015

Related U.S. Application Data

(62) Division of application No. 13/082,238, filed on Apr. 7, 2011, now Pat. No. 8,962,358.

(51) Int. Cl.
| | |
|---|---|
| *H01L 25/075* | (2006.01) |
| *H01L 27/15* | (2006.01) |
| *H01L 33/00* | (2010.01) |
| *H01L 33/62* | (2010.01) |
| *H01L 33/32* | (2010.01) |
| *H01L 33/46* | (2010.01) |
| *H01L 33/48* | (2010.01) |
| *H01L 33/50* | (2010.01) |

(52) U.S. Cl.
CPC .......... *H01L 25/0753* (2013.01); *H01L 27/153* (2013.01); *H01L 33/0079* (2013.01); *H01L 33/32* (2013.01); *H01L 33/46* (2013.01); *H01L 33/486* (2013.01); *H01L 33/507* (2013.01); *H01L 33/62* (2013.01); *H01L 33/50* (2013.01); *H01L 2924/0002* (2013.01)

(58) Field of Classification Search
CPC .............. H01L 25/0753; H01L 27/153; H01L 33/0079; H01L 33/62; H01L 33/32; H01L 33/46; H01L 33/486; H01L 33/507
See application file for complete search history.

(56) References Cited

U.S. PATENT DOCUMENTS

| | | |
|---|---|---|
| 7,122,901 B2 | 10/2006 | Sunohara et al. |
| 8,241,932 B1 | 8/2012 | Yu et al. |
| 2008/0169548 A1 | 7/2008 | Baek |

*Primary Examiner* — Long Pham
(74) *Attorney, Agent, or Firm* — Muncy, Geissler, Olds & Lowe, P.C.

(57) ABSTRACT

The present disclosure provides one embodiment of a light-emitting structure. The light-emitting structure includes a carrier substrate having first metal features; a transparent substrate having second metal features; a plurality of light-emitting diodes (LEDs) bonded with the carrier substrate and the transparent substrate, sandwiched between the carrier substrate and the transparent substrate; and metal pillars bonded to the carrier substrate and the transparent substrate, each of the metal pillars being disposed between adjacent two of the plurality of LEDs, wherein the first metal features, the second metal features and the metal pillars are configured to electrically connect the plurality of LEDs.

20 Claims, 15 Drawing Sheets

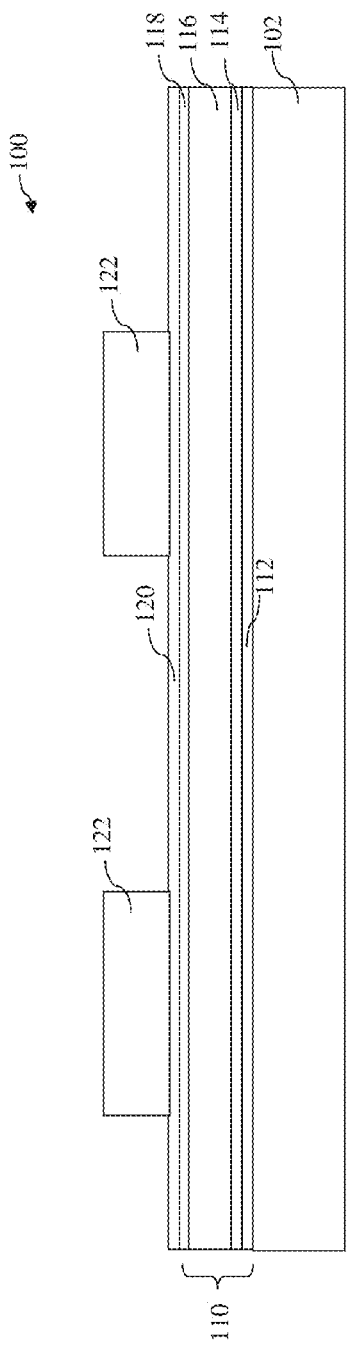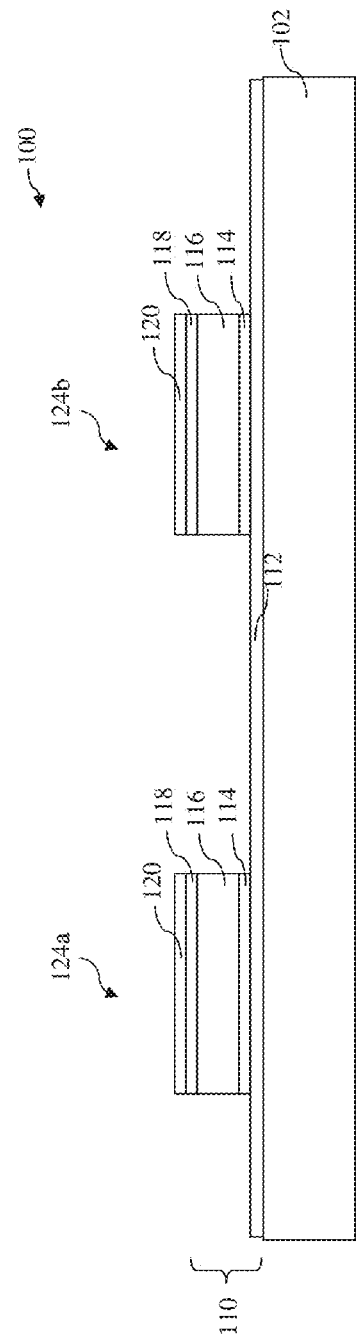

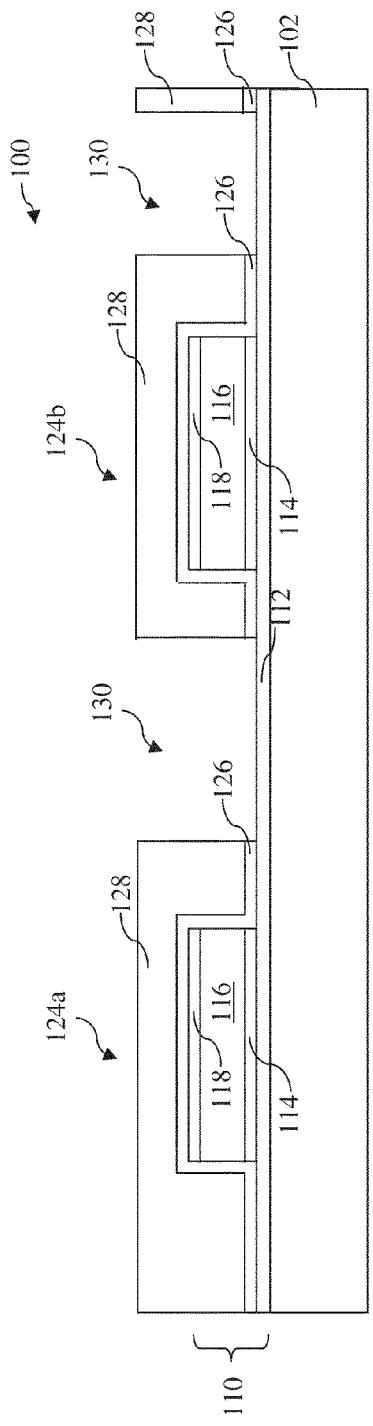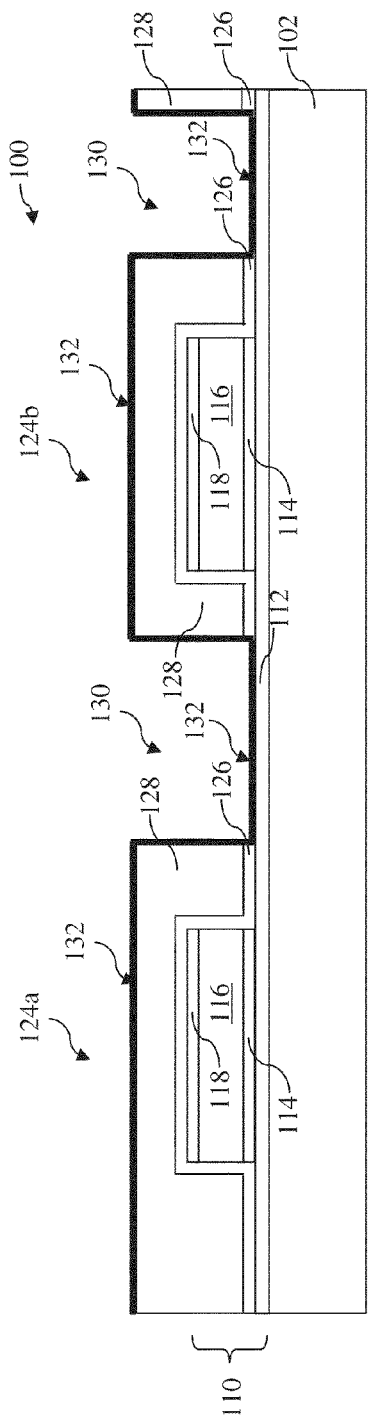

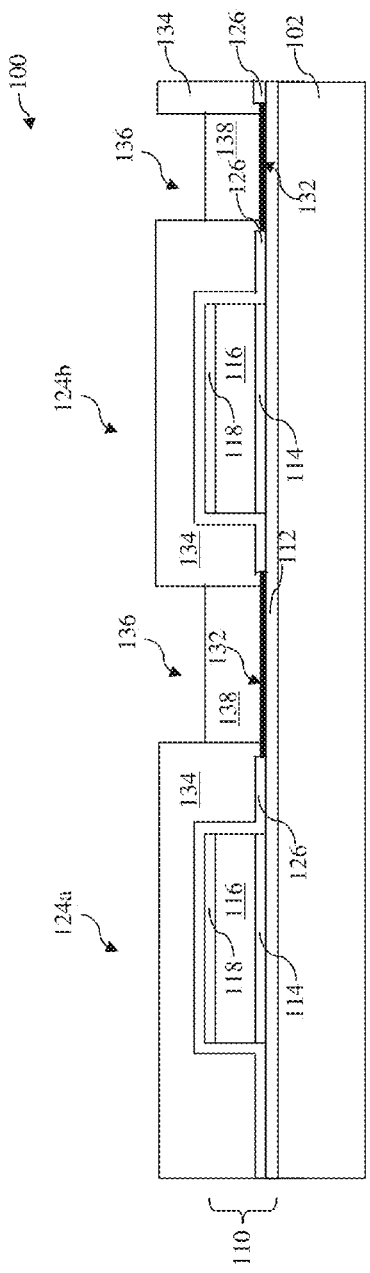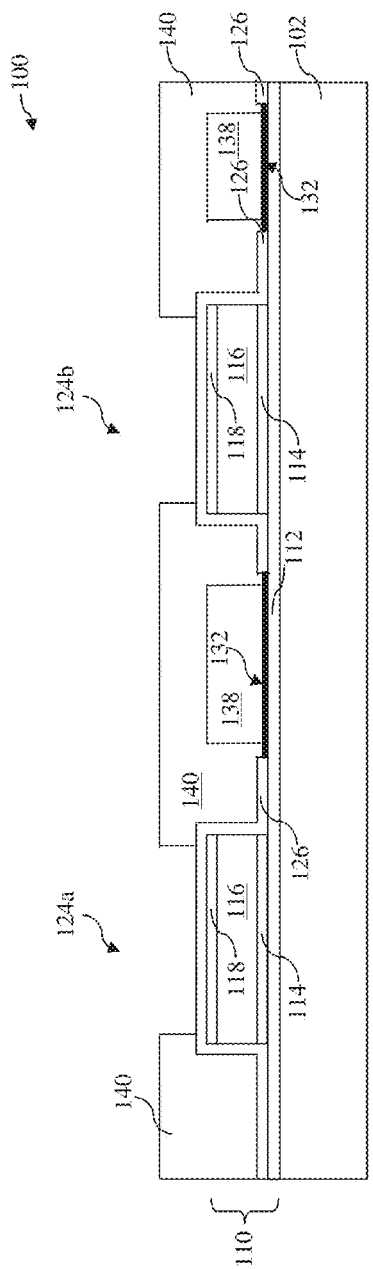

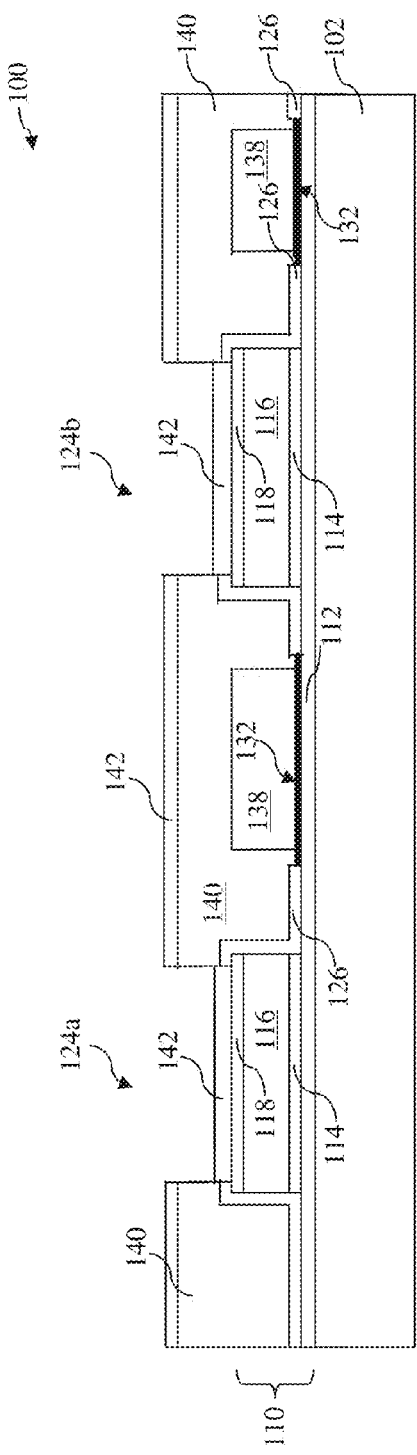
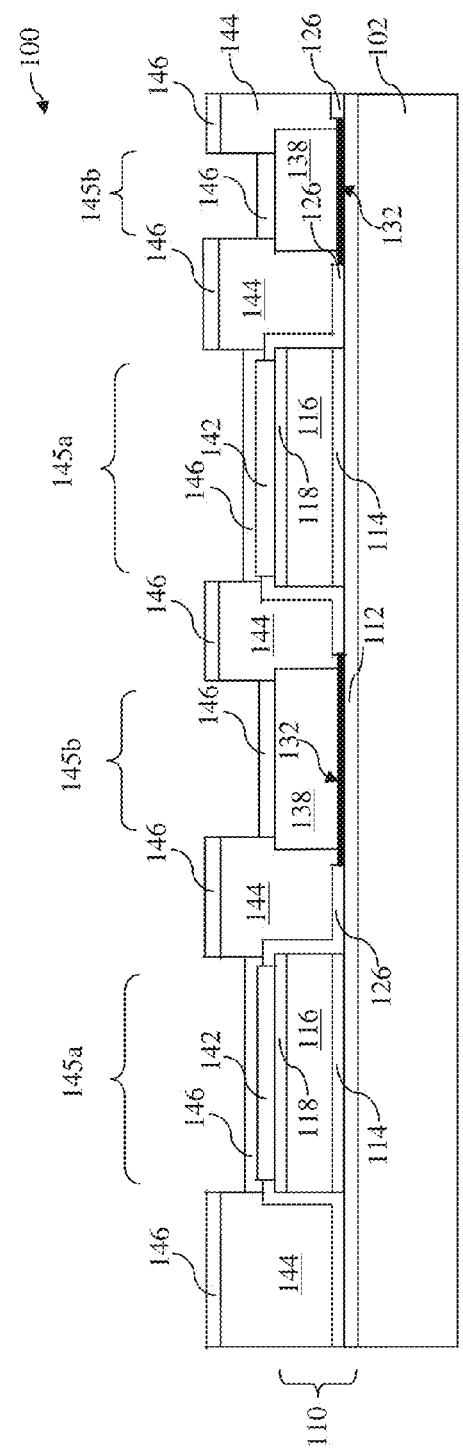

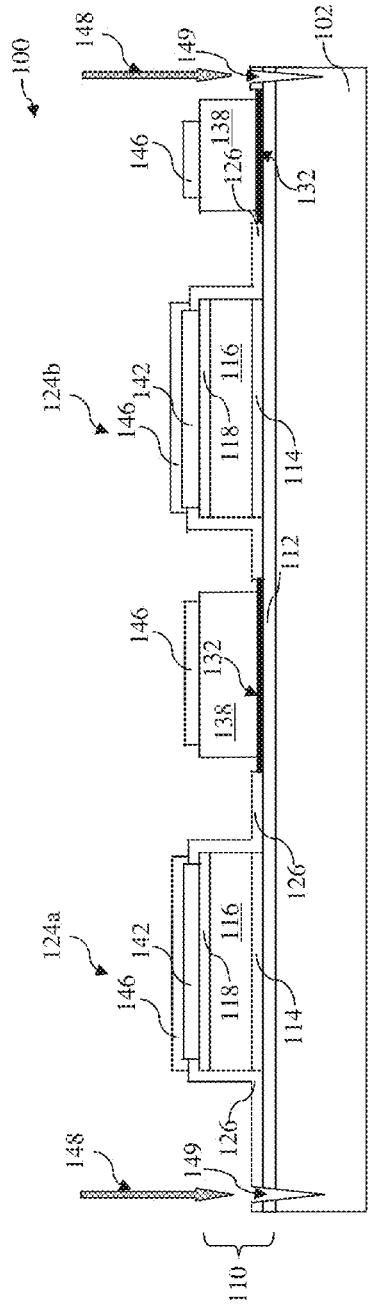
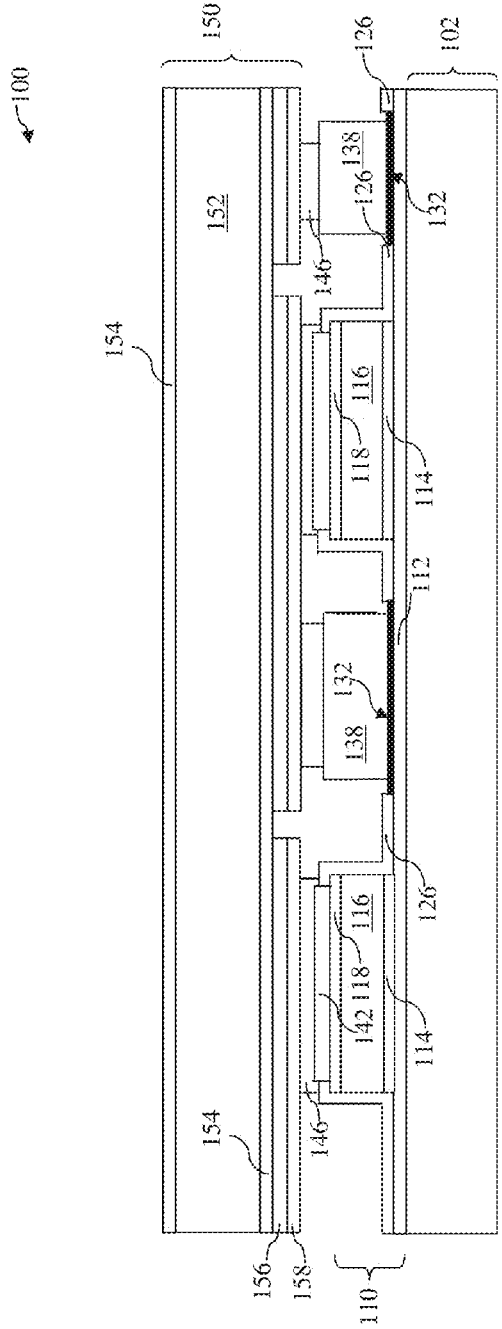

DOUBLED SUBSTRATE MULTI-JUNCTION LIGHT EMITTING DIODE ARRAY STRUCTURE

PRIORITY DATA

The present application is a divisional of U.S. patent application Ser. No. 13/082,238, filed on Apr. 7, 2011, now U.S. Pat. No. 8,962,358, issued Feb. 24, 2015, the disclosure of which is hereby incorporated by reference in its entirety.

CROSS REFERENCE

The present disclosure is related to the following commonly-assigned U.S. patent application, the entire disclosure of which is incorporated herein by reference: U.S. patent application Ser. No. 13/050,549, filed Mar. 17, 2011, by inventors Yu, Chih-Kuang et al for "Method of Fabricating Light Emitting Diode Packages" (attorney reference TSMC2010-1285).

BACKGROUND

A light emitting diode (LED) emits light when a voltage is applied across a P/N junction. During assembly, the LED is bonded to a LED packaging substrate. Conventional LED packages uses wire bonding, which requires certain height and distance on the package. Over the LED, package substrate, and wires, a lens is usually molded. Accordingly, a lens molding of the LED needs a large volume (form factor). Furthermore, when multiple LED dies are packaged into an array, each die is individually attached to the packaging substrate. The interconnection assembling process is sequential. For larger LED package substrates on which thousands or more LEDs are packaged, the cost and time for package are high. Another issue is reliability as LED device applications broaden. In high voltage applications, a multiple LED die array with a planar interconnect structure has a risk of high voltage breakdown. Accordingly, there is a need for a light-emitting structure and a method making the same to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2-18 show cross-sectional views of a light-emitting structure at various fabrication stages constructed according to one or more embodiments of the present disclosure.

DETAILED DESCRIPTION

Figure 1:
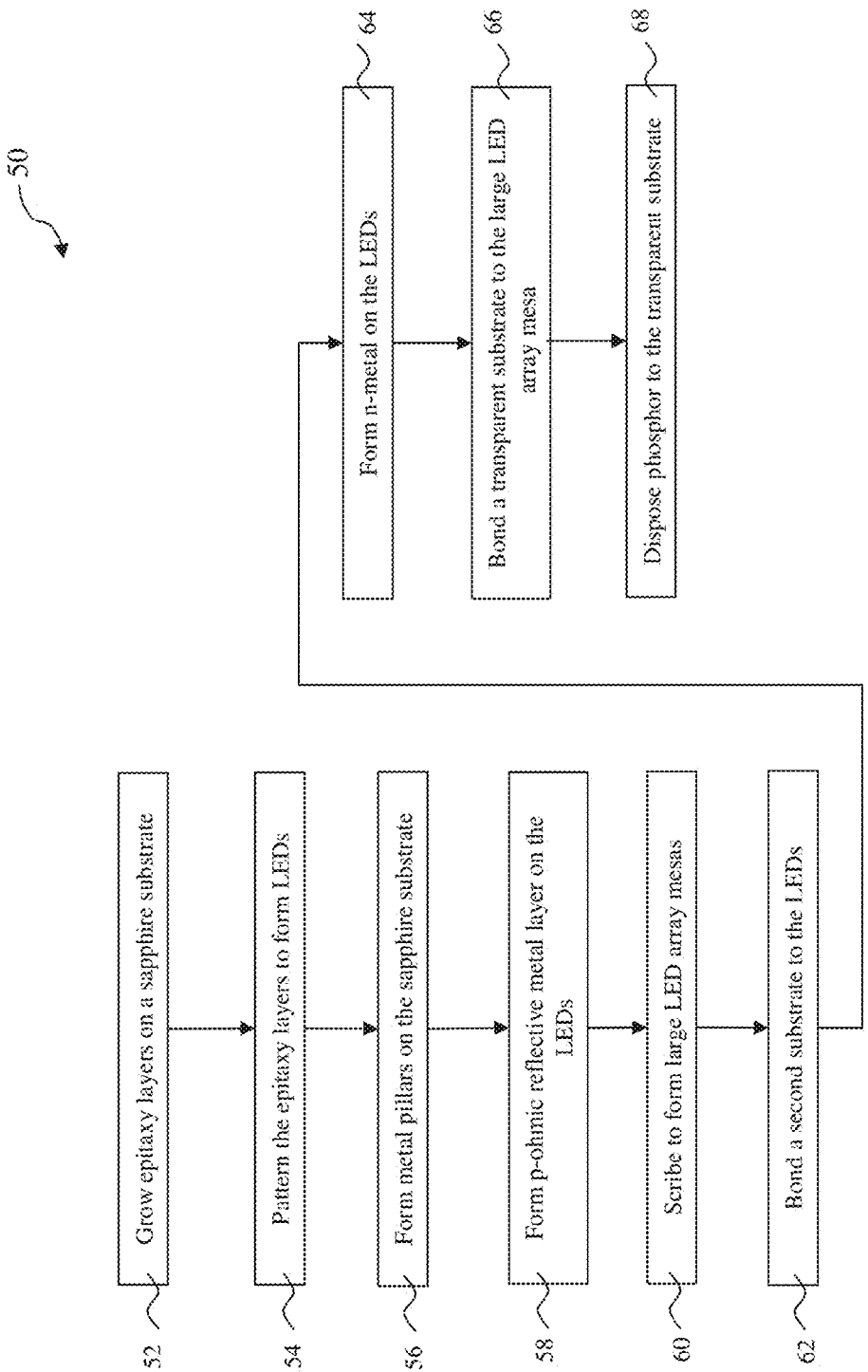
FIG. 1 is a flowchart of a method for making a light-emitting structure according to one or more embodiments.

It is understood that the following disclosure provides many different embodiments, or examples, for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Figure 19:
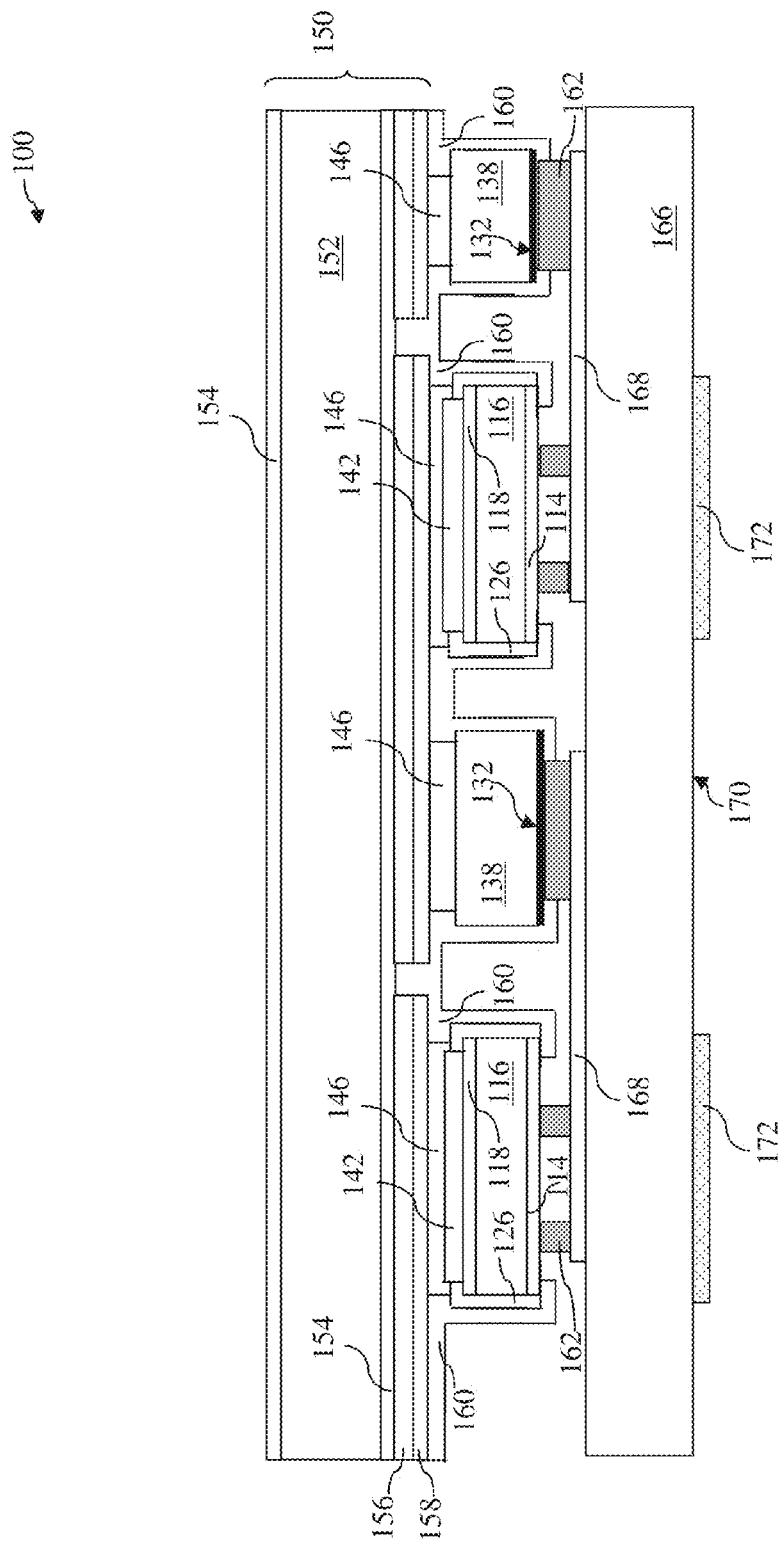
FIGS. 19-21 show cross-sectional views of a light-emitting structure constructed according to various embodiments of the present disclosure.
Figure 20:
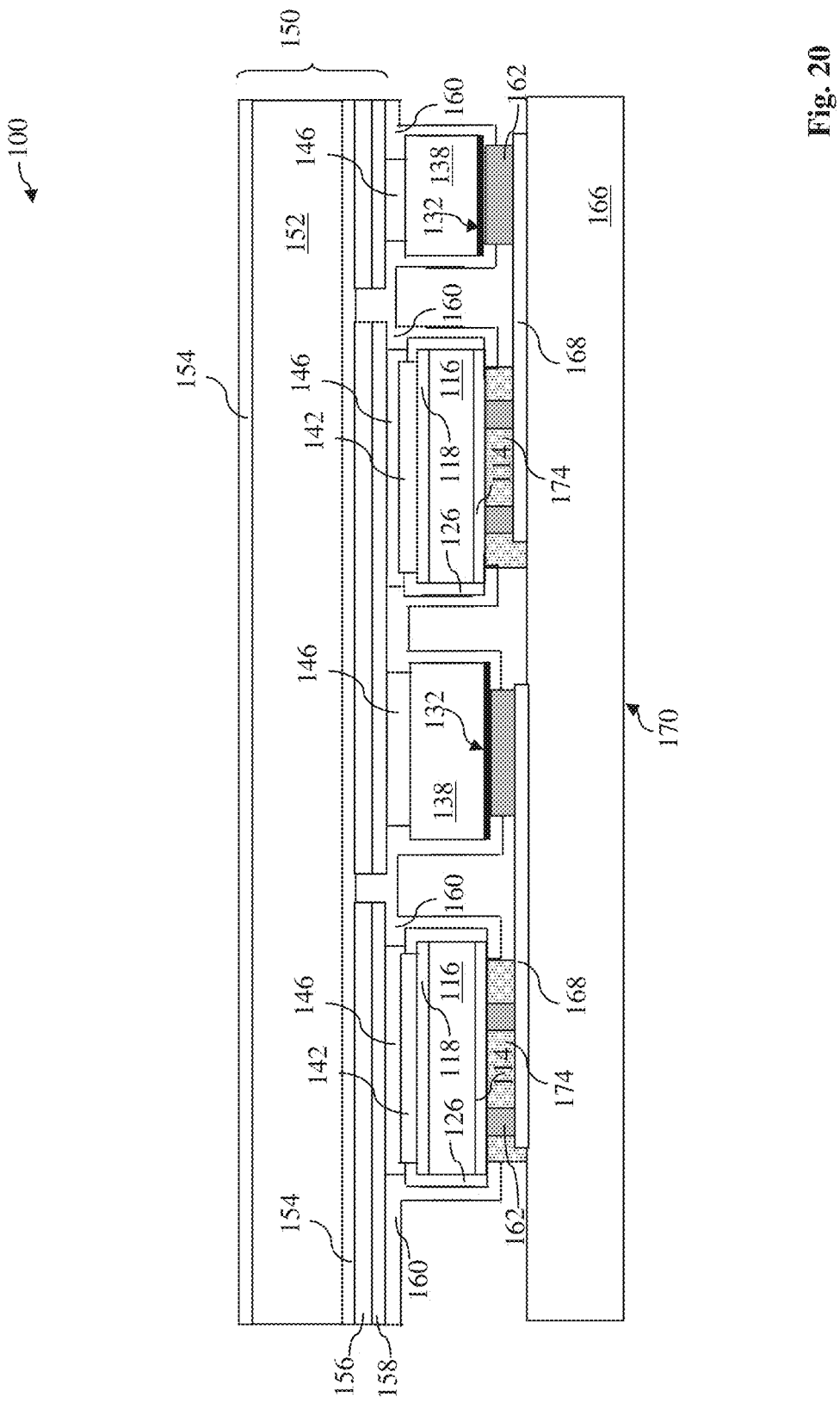
Figure 21:
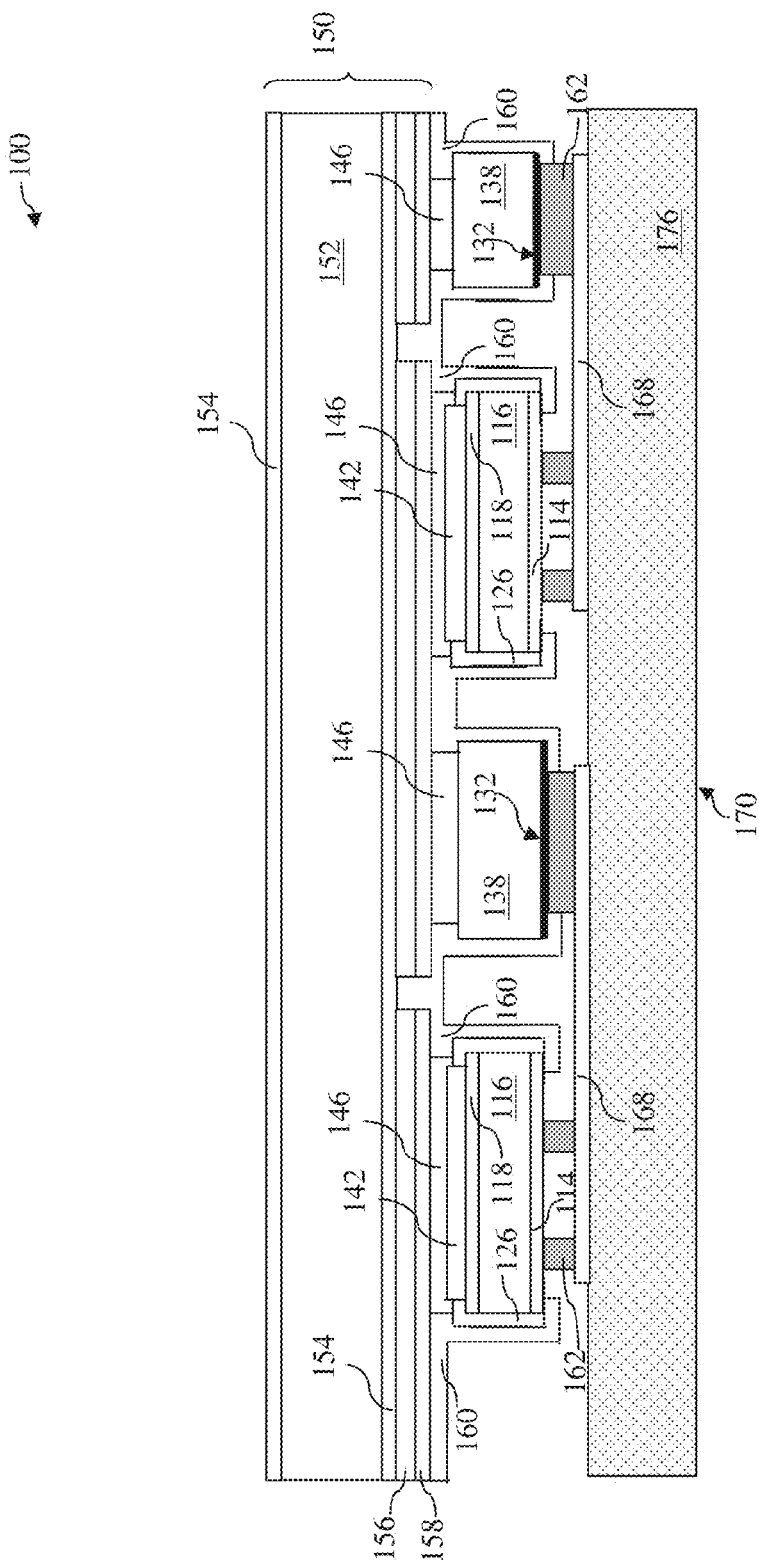

FIG. 1 is a flowchart of a method 50 for making a light-emitting structure according to one or more embodiments. FIGS. 2-18 show cross-sectional views of a light-emitting structure 100 at various fabrication stages of the method 50. FIGS. 19-21 show cross-sectional views of the light-emitting structure 100 having a phosphor constructed according to various embodiments of the present disclosure. With reference to FIGS. 1 through 21, the light-emitting structure 100 and the method 50 of making the same are collectively described.

Referring to FIGS. 1 and 2, the method 50 begins at step 52 by growing various epitaxy semiconductor layers (or epitaxy layers) 110 on a first substrate 102. In the present embodiment, the first substrate 102 is a sapphire substrate. The epitaxy layers 110 are designed to form one or more light-emitting diodes (LEDs). In one embodiment, the expitaxy layers 110 include an n-type doped semiconductor layer and a p-type doped semiconductor layer that emit radiation when a voltage is conducted across them. In another embodiment, the epitaxy layers 110 further include a multiple quantum well (MQW) structure interposed between the n-type doped semiconductor layer and the p-type doped semiconductor layer. The MQW structure includes alternating n-type and p-type doped semiconductor layers. The MQW structure can be tuned to emit a particular wavelength or a narrow range of wavelength radiation. In one embodiment, the epitaxy layers 110 are gallium nitride (GaN) based semiconductor materials. In various examples, those GaN based LEDs emit blue light, red light, green light, or ultra-violet (UV) light. Described below is a particular structure of the epitaxy layers 110 having GaN-based semiconductor materials.

The epitaxy layers 110 include a buffer layer 112 epitaxily grown on the first substrate 102. In one example, the buffer layer 112 includes un-doped GaN, so it is also referred to as un-doped GaN layer (or un-GaN) 112. In furtherance of the example, the buffer layer 112 has a thickness ranging between about 1 micron and about 4 micron.

The epitaxy layers 110 include an n-type doped GaN layer (n-GaN layer) 114 epitaxily grown on the buffer layer 112. The n-GaN layer 114 includes a gallium nitride semiconductor layer doped by n-type dopant, such as silicon. In one example, the n-GaN layer 114 has a thickness ranging between about 1 micron and about 4 micron.

The epitaxy layers 110 include a MQW structure 116 formed on the n-GaN layer 114 by various epitaxy growths. The MQW structure 116 includes a plurality of pairs of semiconductor films. In one example, the MQW structure 116 includes from about 5 to about 15 pairs of the semiconductor films. In another example, the MQW structure 116 has a thickness ranging between 1 nm and about 4 nm. In one embodiment, each pair of semiconductor films includes an indium gallium nitride film and a gallium nitride film (InGaN/GaN). In one example, the InGaN/GaN films are doped alternatively with an n-type dopant and a p-type dopant. In another embodiment, each pair of semiconductor films includes an aluminum gallium nitride film and a gallium nitride film (AlGaN/GaN). In one example, the AlGaN/GaN films are doped alternatively with an n-type dopant and a p-type dopant.

The epitaxy layers 110 include a p-type doped GaN layer (p-GaN layer) 118 epitaxily grown on the MQW structure 116. In one embodiment, the p-GaN layer 118 includes a gallium nitride semiconductor layer doped by p-type dopant, such as magnesium, zinc or combinations thereof. In one example, the p-GaN layer 118 has a thickness ranging between about 1 micron and about 4 micron.

Various materials in the epitaxy layers 110 can be epitaxily grown by metal organic vapor phase epitaxy (MOVPE or MOCVD), hydride vapor-phase epitaxy (HVPE), molecular beam epitaxy (MBE), other suitable technique. In one example, a GaN layer (such as the buffer layer 112, the n-GaN layer 114, the p-GaN layer 118, or GaN film in the MQW structure 116) can be epitaxily grown using gallium-containing precursor and nitrogen-containing precursor. The gallium-containing precursor includes trimethylgallium (TMG), triethylgallium (TEG), or other suitable chemical. The nitrogen-containing precursor includes ammonia ($NH_3$), tertiary-butylamine (TBAm), phenyl hydrazine, or other suitable chemical. In another example, the AlGaN film in the MQW structure 116 can be epitaxy grown using aluminum-containing precursor, gallium-containing precursor, and nitrogen-containing precursor. The aluminum-containing precursor includes TMA, TEA, or other suitable chemical. The gallium-containing precursor includes TMG, TEG, or other suitable chemical. The nitrogen-containing precursor includes ammonia, TBAm, phenyl hydrazine, or other suitable chemical.

Referring to FIGS. 1, 2, and 3, the method 50 proceeds to step 54 by patterning the epitaxy layers 110 (or a subset of the epitaxy layers 110) to form a plurality of light-emitting diodes (LEDs). In one embodiment, the patterning of the epitaxy layers 110 at step 54 includes forming a first hard mask 120 and etching the epitaxy layers 110 using the first hard mask 120 as an etch mask.

First, a dielectric material layer (a hard mask layer, also labeled as 120 for simplicity) is formed on the epitaxy layers 110 as illustrated in FIG. 2. The dielectric material layer 120 includes silicon oxide. The dielectric material layer 120 may be deposited on the epitaxy layers 110 by chemical vapor deposition (CVD). In one example, the silicon oxide is formed by high temperature plasma enhanced CVD (high temperature PECVD). In another example, the silicon oxide is formed by high temperature PECVD using a precursor including silane ($SiH_4$) and oxygen ($O_2$). In other examples, the precursor to form silicon oxide may include hexachlorodisilane (HCD or $Si_2Cl_6$), dichlorosilane (DCS or $SiH_2Cl_2$), bis(tertiarybutylamino)silane (BTBAS or $C_8H_{22}N_2Si$), or disilane (DS or $Si_2H_6$). Other dielectric material may be used for the dielectric material layer 120 if it can function as an effective etch mask during a subsequent etch process. In other embodiments, the dielectric material layer 120 alternatively includes silicon nitride, silicon oxynitride, or silicon carbide. In one embodiment, the dielectric material layer 120 has a proper thickness with enough thickness margin to withstand the subsequent etch process used to remove the epitaxy layers 110. For example, the dielectric material layer 120 has a thickness ranging between about 0.5 micron and about 1 micron.

The dielectric material layer 120 is further patterned to form the hard mask 120. For example, a first patterned photoresist layer 122 is formed on the hard mask layer 120 using a lithography process. The patterned photoresist layer 122 includes various openings that define various regions in which the epitaxy layers 110 are to be etched during the subsequent etch process. As an example, the lithography process includes spin-on coating, baking, exposure, post exposure baking (PEB), and developing. A first etching process is then applied to etch the hard mask layer 120 through the openings of the first patterned photoresist layer 122, forming the hard mask 120 having openings transferred from the openings of the patterned photoresist layer 122. In one embodiment, the first etch process includes a wet etch process, such as hydro-fluorine (HF) or buffered hydro-fluorine (BHF) to remove the hard mask layer 120 of silicon oxide within the openings of the patterned photoresist layer 122. The patterned photoresist layer 122 may be removed by wet stripping or plasma ashing after forming the hard mask 120. In another embodiment, the patterned photoresist layer 122 uses a dry film resist. In this case, the lithography process may be tuned to be compatible with the dry film resist. For example, instead of spin-on coating, the dry film resist is laminated on the hard mask layer 120.

A second etching process is applied to the epitaxy layers 110 through the openings of the hard mask 120 using the hard mask as an etch mask. The second etch process includes dry etch, wet etch, or combinations thereof. The second etching process may include various etching steps, each being designed with a particular etchant to effectively remove one or more respective material layers. In one embodiment, the second etch process includes a dry etch process, such as an inductively coupled plasma reactive ion etch (ICP-RIE). In the present embodiment, the n-GaN layer 114, the MQW 116, and the p-GaN layer 118 within the openings of the hard mask 120 are removed during the second etch process. In one alternative embodiment, the patterned photoresist layer 122 may be removed during the second etch process or after the second etch process. In another embodiment, the hard mask 120 is removed after the second etch process by a proper etchant. For example, BHF or HF is used as the etchant to remove the hard mask 120 of silicon oxide. Alternatively, the hard mask 120 remains after the second etch process and is removed at a later step.

By patterning the epitaxy layers 110 at step 54, the epitaxy layers 110 are patterned to form a plurality of light-emitting diodes (LEDs) 124 on the first substrate 102. FIG. 3 shows two exemplary LEDs 124a and 124b for illustration. In an alternative embodiment, the formation of the plurality of LEDs 124 may avoid using the first hard mask 120 and directly use the patterned photoresist layer 122 as an etch mask during the second etch process to remove the epitaxy layers 110. In this case, the patterned photoresist layer 122 is designed to have enough etch margin during the second etch process for removing the epitaxy layers 110.

Figure 4:
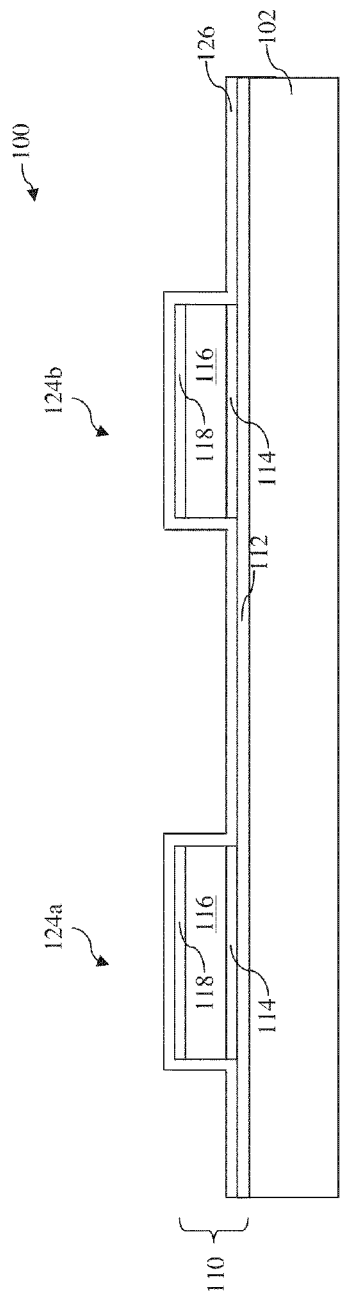

Referring to FIGS. 1 and 4 through 8, the method 50 proceeds to step 56 by forming a plurality of metal pillars on the first substrate 102. At step 56, a second hard mask layer (or a dielectric layer) 126 is formed on the first substrate 102 as illustrated in FIG. 4. In the present embodiment, the second mask layer 126 is disposed on the LEDs 124 and is also disposed on the buffer layer 112 within the gaps between the LEDs 124. In a particular example, the second mask layer 126 is conformal to the surface profile of the light-emitting structure 100 and covers the sidewalls of the LEDs 124a and 124b. The second mask layer 126 on the sidewalls seals and protects the LEDs 124 from leakage. In one embodiment, the second mask layer 126 is substantially similar to the first mask layer 120 in terms of composition and formation. For example, the second mask layer 126 includes silicon oxide formed by high temperature PECVD.

Figure 5:
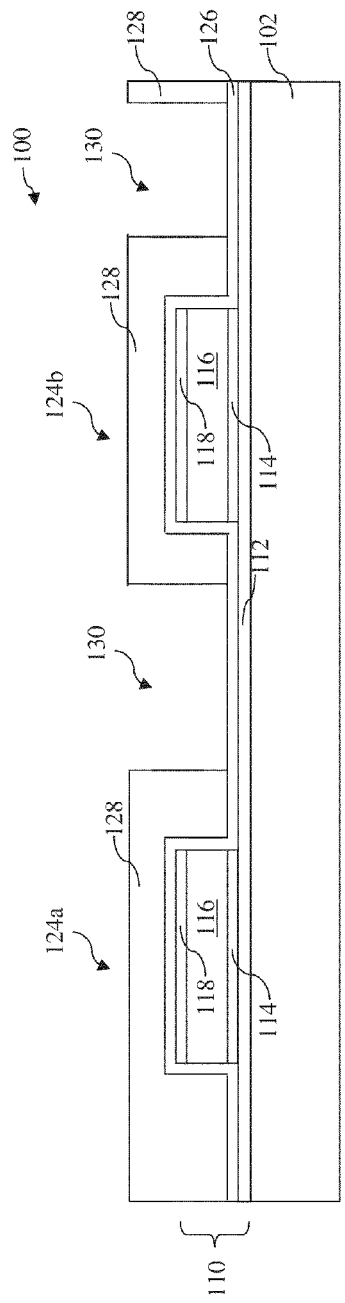

A second patterned photoresist layer 128 is formed on the second hard mask layer 126 as illustrated in FIG. 5 by a lithography process similar to the lithography process used to form the first patterned photoresist layer 122. The second patterned photoresist layer 128 includes openings 130.

An etch process is applied to the second hard mask layer 126 to selectively remove the second hard mask layer 126 within the openings 130, as illustrated in FIG. 6. The second patterned photoresist layer 128 is used as an etch mask during this etch process. This etch process is similar to the etch process applied to the first hard mask layer 120 for patterning the first hard mask 120. For example, BHF or HF can be used as an etchant to selectively remove the second mask layer within the openings 130. In the present embodiment, the buffer layer 112 is exposed within the openings 130 after this etch process.

A seed layer 132 is formed on the first substrate 102 within the openings 130 as illustrated in FIG. 7. In the present embodiment, the seed layer 132 is disposed on the buffer layer 112 within the openings 130. The seed layer is disposed on the second patterned photoresist layer 128 as well. The seed layer 132 is designed for a subsequent plating process, where the metal pillars will be formed thereon. In one embodiment, the seed layer 132 includes titanium copper (TiCu). The seed layer 132 may alternatively include other suitable metal or metal alloy. In the present embodiment, the seed layer 132 is formed by physical vapor deposition (PVD). In one example, the seed layer 132 includes a thickness ranging between about 3000 angstrom and about 7000 angstrom. The second patterned photoresist layer 128 is removed by wet stripping or plasma ashing. The seed layer disposed on the second patterned photoresist layer 128 and on its sidewalls is lifted off during the removal of the second patterned photoresist layer 128.

A third patterned photoresist layer 134 is formed on the second hard mask layer 126 by a lithography process similar to the lithography process used to form the first patterned photoresist layer 122. In the present embodiment, the third patterned photoresist layer 134 is partially disposed on the seed layer 132 as illustrated in FIG. 8. In furtherance of the present embodiment, the third patterned photoresist layer 134 is similar to the second patterned photoresist layer 128 in dimensions but with offset to partially cover the seed layer 132 in order to reduce misalignment and associated misalignment issues. The third patterned photoresist layer 134 includes openings 136 defining regions for the metal pillars. In the present embodiment, the openings 136 have a width smaller than a width of the openings 130.

A plating process is implemented to form metal pillars 138 on the seed layer 132 within the openings 136 of the third patterned photoresist layer 134 as illustrated in FIG. 8. In the present embodiment, the plating process forms the metal pillars 138 self-aligned with the seed layer 132. In one embodiment, the metal pillars 138 have a thickness such that the top surface of the metal pillars 138 is substantially coplanar with the top surface of the LEDs 124. In one example, the metal pillars 138 have a thickness ranging between about 5 micron and about 7 micron. The metal pillars 138 may include any suitable metal or metal alloy. In the present embodiment, the metal pillars 138 include copper (Cu) formed by Cu plating. The metal pillars 138 are configured approximate to the LEDs 124 to provide interconnection paths for electrically connecting the LEDs 124. In one embodiment, the metal pillars 138 are configured such that each metal pillar is positioned between two adjacent LEDs 124.

Alternatively, the metal pillars 138 may be formed by other technology/procedure according to various other embodiments. In one embodiment, a planarizing process is applied to the light-emitting structure 100 to reduce the thickness of the metal pillars 138 such that the top surface of the LEDs 124 and the top surface of the metal pillars 138 are substantially coplanar. In one example, the planarizing process includes a chemical mechanical polishing (CMP). In another example, the planarizing process can be implemented after the removal of the third patterned photoresist layer 134. In yet another example, the planarizing process is designed and tuned to properly stop on the second hard mask layer 126. In another embodiment, the seed layer can be formed by a technique such as electro-less plating. In yet another embodiment, the metal pillars 138 can be formed without a seed layer so the seed layer 132 is eliminated. In one example, the metal pillars 138 are deposited by a suitable technique, such as metal evaporation. The evaporated metal on the third patterned photoresist layer 134 is lifted off during the removal of the third patterned photoresist layer 134. In another example, the metal pillars 138 are deposited by electro-less plating. If the electro-less plating is non-selective and is deposited on the third patterned photoresist layer 134 as well, the plated metal on the third patterned photoresist layer 134 will be lifted off during the removal of the third patterned photoresist layer 134. In yet another example, the electro-less plating process includes two plating steps, in which the first electro-less plating step is tuned to plate a first metal selectively on the buffer layer 112 within the openings 130 and the second electro-less plating step is tuned to plate a second metal selectively on the plated first metal.

Referring to FIGS. 1 and 9 through 12, the method 50 proceeds to step 58 by forming a p-ohmic reflective metal on the LEDs 124. The third patterned photoresist layer 134 is removed by wet stripping or plasma ashing. A fourth patterned photoresist layer 140 is formed on the first substrate 102 as illustrated in FIG. 9. The fourth patterned photoresist layer 140 covers the metal pillars 138 and partially covers the second hard mask layer 126. The fourth patterned photoresist layer 140 includes openings aligned with the LEDs 124. A portion of the second hard mask 126 on the top surface of the LEDs 124 and within the openings of the fourth patterned photoresist layer 140 is exposed for etching. In the top view, the openings of the fourth patterned photoresist layer 140 are smaller than the LEDs 124 to reduce misalignment and associated misalignment issues according to one embodiment. In the present embodiment, the fourth patterned photoresist layer 140 is similar to the third patterned photoresist layer 134 in terms of composition and formation. In one example, a photoresist layer is formed on the light-emitting structure 100 by spin-on coating and then patterned by a lithography patterning process. In another example, a dry film resist is laminated on the light-emitting structure 100 and is then patterned by the corresponding lithography patterning process.

An etch process is applied to selectively remove the second hard mask layer 126 within the openings of the fourth patterned photoresist layer 140, as illustrated in FIG. 10. The fourth patterned photoresist layer 140. is used as an etch mask during the etch process. The etch process applied to the second hard mask layer 126 is similar to the etch process applied to the first hard mask layer 120. For example, BHF or HF can be used as an etchant to selectively remove the second hard mask layer 126 within the openings of the fourth patterned photoresist layer 140. In the present embodiment, the p-GaN layer 118 of the LEDs 124 is exposed within corresponding openings after the etch process.

A metal layer 142 is deposited on the exposed p-GaN layer 118 as illustrated in FIG. 10. The metal layer 142 is chosen to have high reflectivity to effectively reflect light emitted from the LEDs 124 for LED emission efficiency, and to have high conductivity to provide electrical contact to the p-GaN layer 118 of the LEDs 124. Therefore, the metal layer 142 is also referred to as a p-ohmic reflective metal layer 142. In the present embodiment, the metal layer 142 includes aluminum (Al). Alternatively, the metal layer 142 includes other suitable metal such as silver (Ag). In one embodiment, the metal layer 142 includes multiple metal films for enhanced reflection, conductivity, and adhesion. In one example, the metal layer 142 includes nickel, silver, and nickel films stacked together. In another embodiment, the metal layer 142 is deposited by a process such as PVD, e-beam, CVD, or other known processes. The metal layer 142 is also formed on the fourth patterned photoresist layer 140. In one example, the metal layer 142 has a thickness ranging between about 7000 angstrom and about 8000 angstrom. Thereafter, the fourth patterned photoresist layer 140 is removed by wet stripping or plasma ashing. The metal layer 142 disposed on the fourth patterned photoresist layer 140 is lifted off during the removal of the fourth patterned photoresist layer 140.

A fifth patterned photoresist layer 144 is formed on the first substrate 102 by a lithography process. In the present embodiment as shown in FIG. 11, the fifth patterned photoresist layer 144 includes first openings 145a to expose the metal layer 142 and additionally includes second openings 145b to expose the metal pillars 138. The fifth patterned photoresist layer 144 is substantially disposed on the second mask layer 126. In furtherance of the present embodiment, the first openings of the fifth patterned photoresist layer 144 are larger than the openings of the fourth patterned photoresist layer 140 with offset to partially expose the second hard mask layer 126.

As illustrated in FIG. 11, a bonding metal layer 146 is formed on the first substrate 102 and designed for wafer bonding. The bonding metal layer 146 is disposed on the p-ohmic reflective metal layer 142 and the metal pillars 138. In one example, the bonding metal layer 146 includes gold (Au), gold tin (AuSn), gold indium (AuIn), or other suitable metal to achieve eutectic bonding, diffusion bonding, or other suitable bonding mechanism. In one embodiment, the bonding metal layer 142 can be formed by PVD, e-beam, or other suitable technique. In another embodiment, the bonding metal layer 146 has a thickness ranging between about 1 micron and about 2 micron. The bonding metal layer 146 may also include titanium and platinum. A portion of the bonding metal layer 146 may serve as a diffusion barrier against metal ion migration.

As illustrated in FIG. 12, the fifth patterned photoresist layer 144 is removed by wet stripping or plasma ashing. The bonding metal layer 146 disposed on the fifth patterned photoresist layer 144 is lifted off during the removal of the fifth patterned photoresist layer 144. The method 50 proceeds to step 60 by performing a scribing process 148 to form large LED array mesas. In one embodiment, a laser energy is applied to the first substrate 102 to form V-shaped trenches 149 on the first substrate 102 and then mechanical force is employed to break up the first substrate 102 through the V-shaped trenches 149. Thus, the first substrate 102 is separated into a plurality of large LED array mesas. Each LED array mesa includes multiple LEDs 124 (also referred to as multi-junctions) to be electrically connected through the followings steps of the method 50. The multiple LEDs 124 on each LED array mesa are formed and to be bonded to another substrate simultaneously as one unit through all steps of the method 50. In FIG. 12, only one LED array mesa having two LEDs is illustrated for simplicity.

Referring to FIGS. 1 and 13, the method 50 proceeds to step 62 by bonding a second substrate (or carrier substrate) 150 to the plurality of LEDs 124 by a bonding mechanism, such as eutectic bonding, diffusion bonding, or other suitable bonding. Particularly, the second substrate 150 is bonded to the plurality of LEDs 124 and the metal pillars 138 as illustrated in FIG. 13.

The second substrate 150 is prepared before bonding to the LEDs 124. In one embodiment, the second substrate 150 includes a carrier wafer 152, such as silicon wafer. In another embodiment, the second substrate 150 includes a dielectric layer 154 formed over both sides of the carrier wafer 152 for isolation and passivation. In various embodiments, the dielectric layer 154 includes a dielectric material, such as silicon oxide, silicon nitride, silicon carbide, diamond-like carbon (DLC), ultra-nanocrystalline diamond (UNCD), aluminum nitride (AlN), or combinations thereof. The dielectric layer 154 may be deposited by a CVD process or a thermal oxidation process.

One or more metal layers are formed on the bonding side of the carrier wafer 152 configured for interconnection and bonding. In one embodiment, the second substrate 150 includes an interconnect metal layer 156 formed on the dielectric layer 154. In one example, the interconnect metal layer 156 includes copper or other suitable metal. The interconnect metal layer 156 may be formed by PVD or other suitable technique. As an example, the interconnect metal layer can be formed by a plating process. In this case, a seed layer (not shown) is first deposited on the dielectric layer 154 and then a plating process is implemented to form the interconnect metal layer 156 on the seed layer. The seed layer may include copper (Cu), titanium (Ti) or titanium tungsten (TiW) and can be formed by a suitable process, such as PVD.

In various embodiments, the second substrate 150 includes a bonding metal layer 158 formed on the interconnect metal layer 156. The bonding metal layer 158 is chosen to enable eutectic bonding or other suitable bonding mechanism. In various embodiments, the bonding metal layer 158 include metal or metal alloy with good conductive properties (both electrical and thermal) and good bonding property, such as gold, gold alloy, copper, copper alloy, nickel, nickel alloy, platinum, platinum alloy, titanium, titanium alloy, or combinations thereof. The bonding metal layer 158 is deposited by a suitable process, such as PVD or plating.

The interconnect metal layer 156 and the bonding metal 158 are patterned to provide proper bonding effect and interconnection. The patterning of the metal layers 156 and 158 can be achieved by a suitable technique. In one embodiment, a patterned photoresist layer is formed on the dielectric layer 154 on the bonding side of the carrier wafer 152. The patterned photoresist layer includes openings defined in the regions for the interconnect metal layer 156 and the bonding metal layer 158. Then, the interconnect metal layer 156 and the bonding metal layer 158 are deposited on the dielectric layer 154 within the openings of the patterned photoresist layer and on the top surface of the patterned photoresist layer. Thereafter, the patterned photoresist layer is removed and the corresponding metal layers 156 and 158 are lifted off during the removal of the patterned photoresist layer. The metal layers 156 and 158 can be formed by PVD and plating. When the plating is used to form the metal layers 156 and 158, an alternative procedure can be implemented and includes forming the patterned seed layer. Then, a plating process including multiple plating steps is implemented to form the metal layers 156 and 158. Thus, the metal layers 156 and 158 are self-aligned to the patterned seed layer 112. As one example, the interconnect metal layers 156 of copper are metal plated over the copper seed layer using processes such as an electrochemical plating process. The forming of the patterned seed layer can be achieved by forming a seed layer and then patterning the seed layer using a lithography process or by forming a patterned photoresist layer, depositing a seed layer and then removing the patterned photoresist layer. In this case, the undesired portion of the seed layer is lifted off during the removal of the patterned photoresist layer.

After the second substrate 150 is prepared, it is bonded to the LEDs 124 on the first substrate 102. During the bonding process, the bonding metal layer 146 is aligned and is landed onto the bonding metal 158 to achieve the eutectic bonding or other proper bonding mechanism. In one embodiment, a thermal energy and a mechanical force are applied to complete the bonding between the bonding metal layers 146 and 158. In an alternative embodiment, the material of the bonding metal layer 146 and the material of the bonding metal layer 148 are switched.

Figure 14:
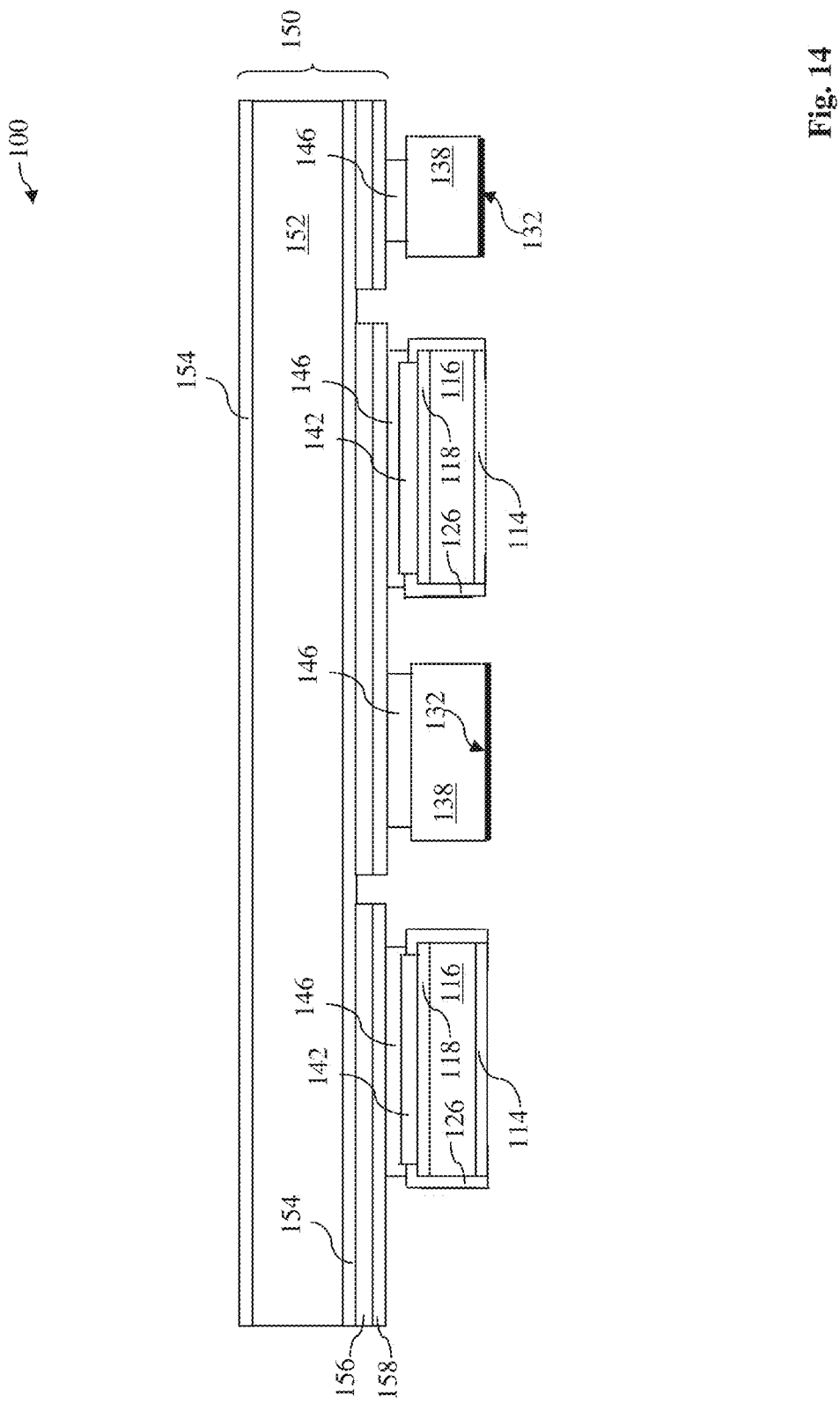

Referring to FIGS. 1 and 14, the first substrate 102 is removed from the LEDs 124. In one embodiment, the first substrate 102 is removed by a laser lift-off (LLO) process. During the LLO process, a laser applies a radiation energy to separate the first substrate 102 from the buffer layer 112. An etch process is further applied to remove the buffer layer from the LEDs 124 and the metal pillars 138, using an etch technique and suitable etchant. An over etch may be performed to ensure complete removal of the buffer layer 112. The second hard mask layer 126 within the regions between the LEDs 124 and the metal pillars 138 may be removed as well by the etch process. Alternatively, an additional etch process is subsequently applied to remove the portion of the second hard mask layer 126 within the regions between the LEDs 124 and the metal pillars 138. For example, a dry etch process, such as RIE, using fluorine-containing etchant may be implemented to remove the portion of the second hard mask layer 126.

Figure 15:
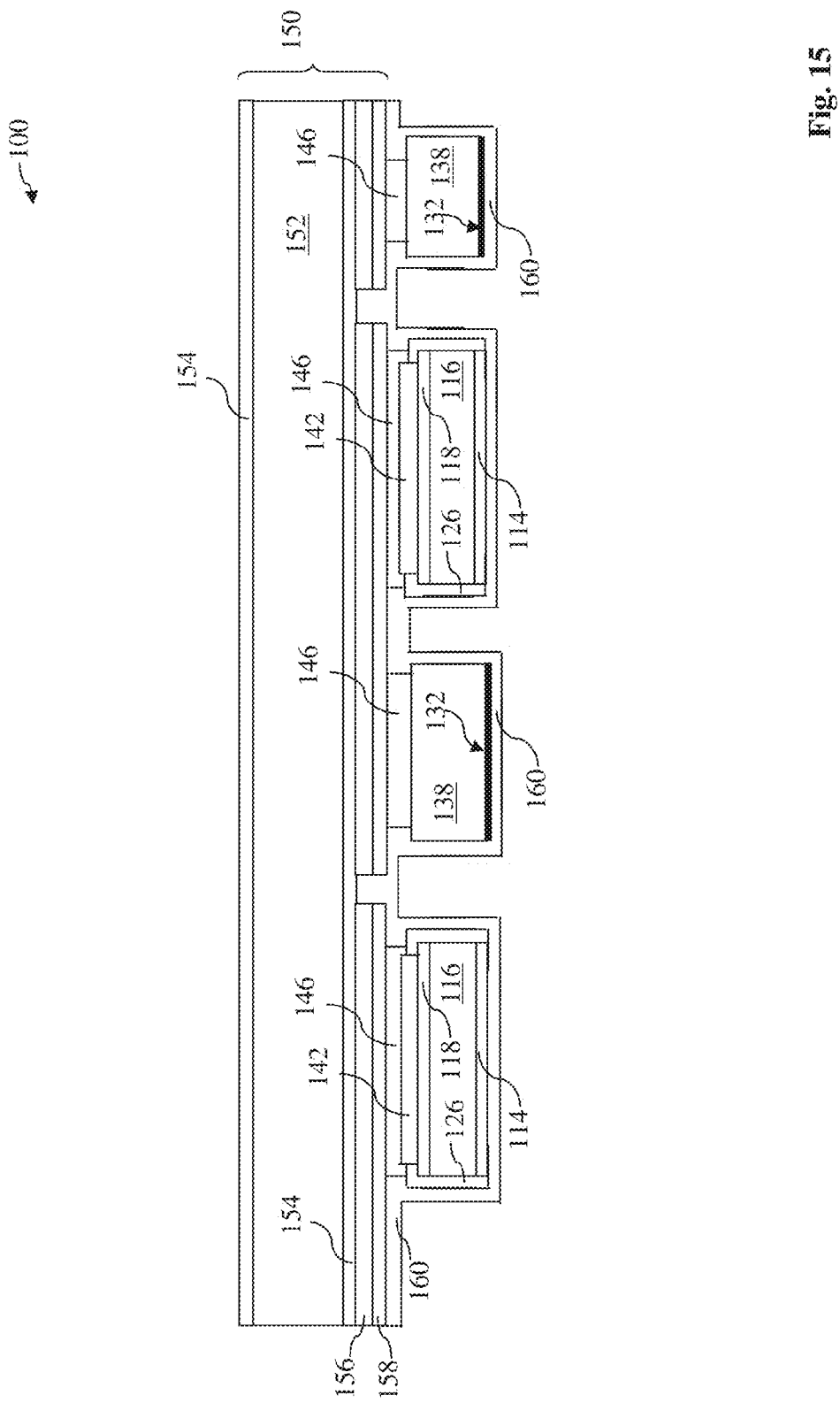

Referring to FIGS. 1 and 15 through 17, the method 50 proceeds to step 64 by forming a contact metal layer (n-metal) over the n-GaN layer 114. First, a third hard mask layer 160 is formed on the LED side of the light-emitting structure 100 as illustrated in FIG. 15. The third hard mask layer 160 is similar to the first hard mask layer 120 in terms of composition and formation. For example, the third mask layer 160 includes silicon oxide formed by high temperature PECVD. The third hard mask layer 160 is conformal to the LED side profile of the light-emitting structure 100 and substantially covers the LEDs 124 and metal pillars 138 as illustrated in FIG. 15.

Figure 16:
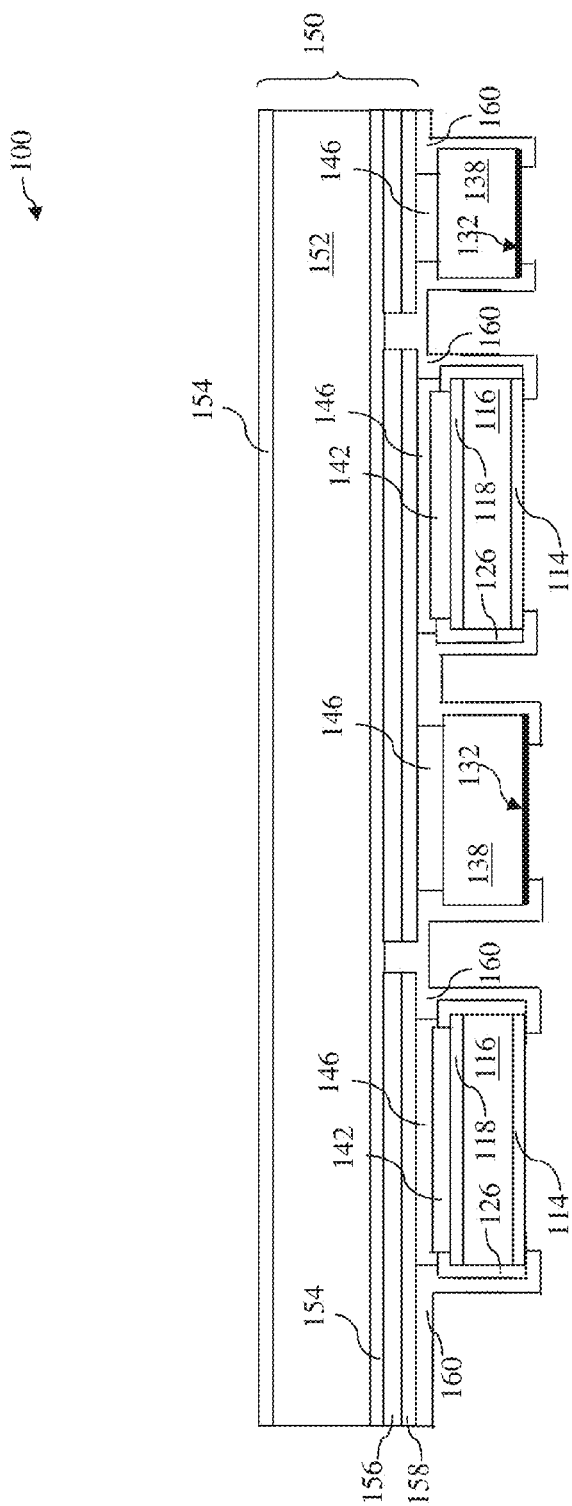

Then the third hard mask layer 160 is patterned to form various openings on the LEDs 124 and the metal pillars 138, exposing top surfaces of the LEDs 124 and the metal pillars 138 as illustrated in FIG. 16. The patterning of the third hard mask layer 160 is similar to the patterning of the first hard mask layer 120. In one embodiment, the patterning of the third hard mask layer 160 includes a lithography process and an etch process. In one example, a patterned photoresist layer is formed on the third hard mask layer 160 by a lithography process similar to the lithography process used to form the first patterned photoresist layer 122. The patterned photoresist layer includes various openings aligned with the LEDs 124 and the metal pillars 138. An etch process is applied to the third hard mask layer 160 to selectively remove the third hard mask layer 160 within the openings of the patterned photoresist layer. This etch process applied to the third hard mask layer 160 is similar to the etch process applied to the first hard mask layer 120 for patterning the first hard mask 120. For example, BHF or HF can be used as an etchant to selectively remove the third hard mask layer 160 within the openings.

Figure 17:
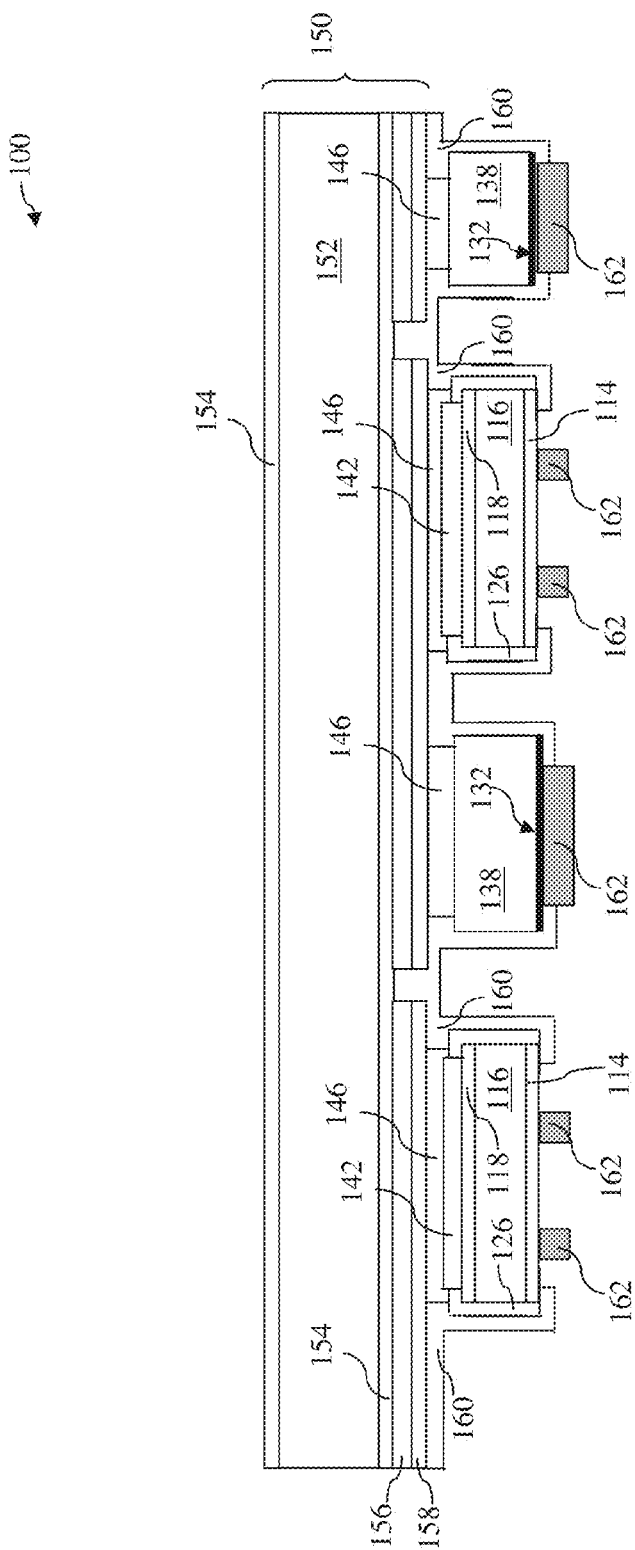

Then, contact metal layer 162 is formed on the n-GaN layer 114 and is formed on the metal pillars 138 as well as illustrated in FIG. 17. The contact metal layer 162 is also referred to as n-metal 162. The contact metal layer 162 is formed by a procedure similar to the procedure to form the p-ohmic reflective metal layer 142. In one embodiment, the procedure includes forming a patterned photoresist layer having openings; depositing a metal layer on the patterned photoresist layer and on the n-GaN layer 114 within the openings of the patterned photoresist layer; and removing the patterned photoresist layer and lifting off the metal layer on the patterned photoresist layer. In various examples, the metal layer is deposited by PVD, e-beam, or other suitable processes. The n-metal 162 includes a suitable metal, such as titanium, platinum, gold, chromium, or aluminum. The n-metal 162 is patterned to provide proper wiring path for electrically connecting the LEDs 124 in the LED array mesa. In one example, the n-metal 162 includes two separate metal features positioned on each of the LEDs 124 for electrically connecting two adjacent metal pillars 138 to couple the LEDs 124 of the LED array mesa in series. The n-metal 162 also functions for bonding effect. In various embodiments, the n-metal 162 includes multiple metal films integrated for interconnection and bonding. In one embodiment, the metal layer 168 includes a first metal film disposed on the n-GaN layer 114 for interconnection and a second metal film disposed on the first metal film for bonding. In this case, the second metal film is chosen to achieve eutectic bonding, diffusion bonding, or other proper bonding mechanism.

Figure 18:
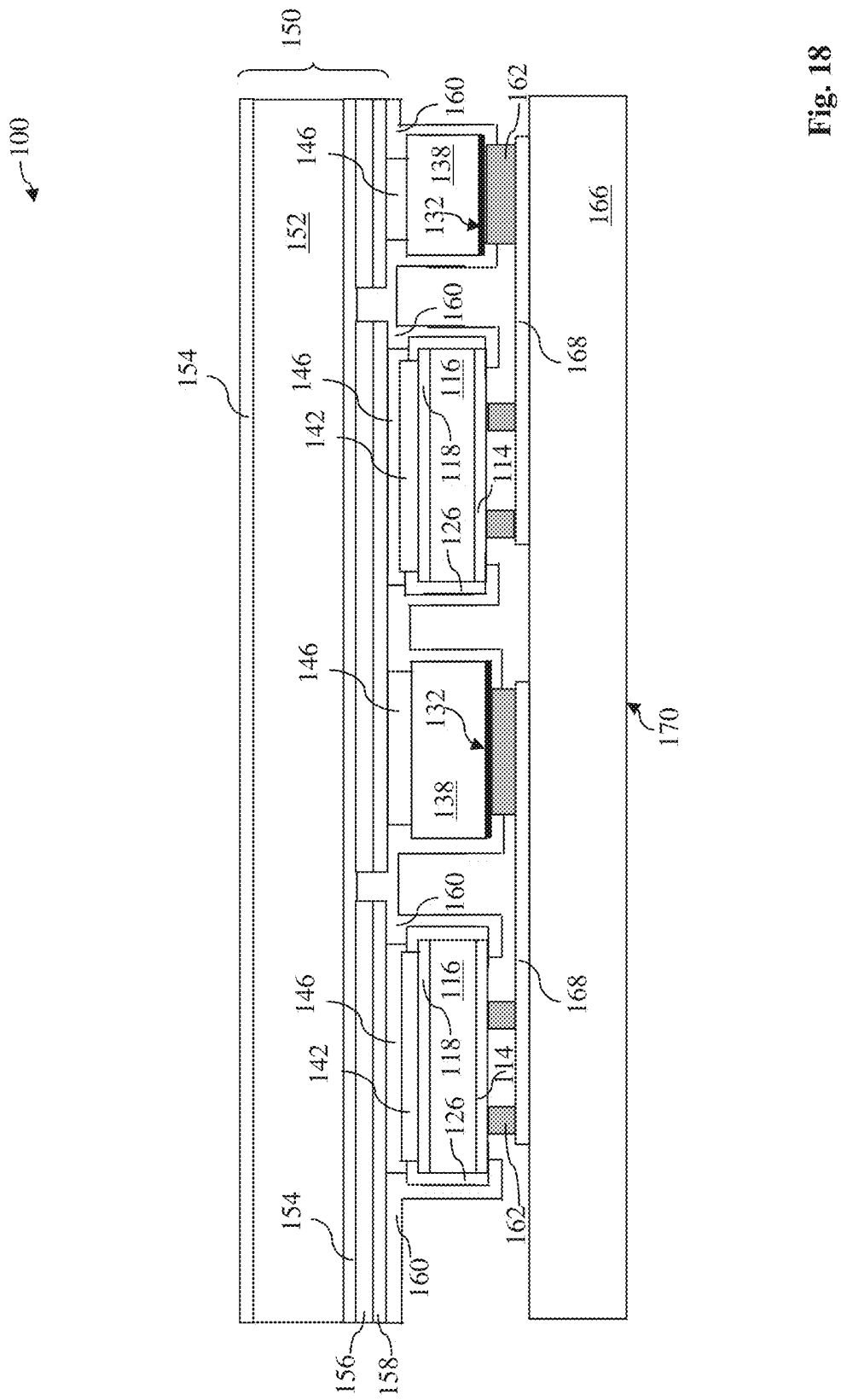

Referring to FIGS. 1 and 18, the method 50 proceeds to step 66 by bonding a third substrate 166 to the LEDs 124 on the large LED array mesa. The third substrate 166 is transparent to the light emitted from the LEDs 124. The third substrate 166 is also bonded to the metal pillars 138. In one embodiment, the third substrate 166 is a glass (referred to as a glass cap). Before bonding the third substrate 166 to the LEDs 124, a metal layer 168 is formed on the third substrate 166. The metal layer 168 functions for bonding and interconnection. In various embodiments, the metal layer 168 includes multiple metal films integrated for interconnection and bonding. In one embodiment, the metal layer 168 includes a first metal film for interconnection and a second metal film for bonding. In another embodiment, the metal layer 168 includes a first metal film for adhesion and a second metal film for bonding. In yet another embodiment, the metal layer 168 includes only one metal film chosen for adhesion, interconnection, and bonding. In one example, the metal layer 168 includes gold (Au), gold tin (AuSn), gold indium (AuIn), or other suitable metal to achieve eutectic bonding, diffusion bonding, or other suitable bonding mechanism. In one embodiment, the metal layer 168 can be formed by PVD or other suitable technique. The metal layer 168 is further patterned to be aligned with the n-metal 162 and to provide proper electrical connection.

In the present embodiment, the LEDs 124 in the LED array mesa are electrically connected in series through the metal pillars 138, the metal layer 168 of the third substrate 166, the metal layers 156/158, the n-metal 162, and the p-ohmic reflective metal layer 142. The series connected LEDs 124 of the LED array mesa provides a structure for high voltage LED application. In another embodiment, various metal features are designed and configured to provide electrical connection to the LEDs 124 of the LED array mesa such that the LEDs are electrically connected in series and parallel configuration. For example, the LEDs 124 of the LED array mesa are grouped into two or more subsets. The LEDs 124 in each subset are electrically connected in series and the subsets are electrically connected in parallel. Alternatively, the LEDs 124 in each subset are electrically connected in parallel and the subsets are electrically connected in series. Instead of using a planar interconnection, a vertical interconnection among the LEDs 124 is achieved by directly connecting the p-GaN layer 118 of the LEDs 124 to the metal features 156 and 158 on the second substrate 150 and connecting the n-GaN layer 114 of the LEDs 124 to the metal features 168 on the third substrate 166, without wiring. Further with the metal pillars 138, various electrical couplings (series, parallel, or combination) are achieved.

In an embodiment, the third substrate 166 includes a rough surface 170. The rough surface 170 can be formed during the preparation of the third substrate 166. In one example, the rough surface 170 is formed by etching, polishing, or a combination thereof. Particularly, if the glass cap is used for the third substrate 166, HF or BHF is used for etching to form the rough surface.

Referring to FIGS. 1 and 19 through 21, the method 50 proceeds to step 68 by disposing a phosphor 172 to the third substrate 166. In one embodiment as illustrated in FIG. 19, the phosphor 172 is distributed on the third substrate 166 and is aligned with the LEDs 124, respectively. The phosphor 172 is luminescent material used to shift the wavelength of the emitted light. In one embodiment, the phosphor embedded in a carrier material (or coating material) is formed on the rough surface 170 of the third substrate 166. The phosphor coating may be deposited using a mask or through screen printing to form a surface phosphor layer on the rough surface 170 of the third substrate 166. Alternatively, the phosphor coating may be deposited through a spray process to form a phosphor layer. In another embodiment, the phosphor and the carrier material may be formed on the rough surface 170 through molding to form a phosphor layer patterned to be aligned with the LEDs 124 with proper geometry for lens effect to enhance the emission effect.

In another embodiment as illustrated in FIG. 20, phosphor 174 is disposed between the third substrate 166 and the LEDs 124. In furtherance of this embodiment, the phosphor carrier material can be designed to be conductive. Thus, the phosphor with its carrier material not only functions as a luminescent material but also functions for interconnection to electrically couple the LED to the metal layer 168. For example, the phosphor carrier material and the corresponding formation method are similar to those of the phosphor 172 in FIG. 19 but further designed to be conductive or use other conductive glue as a carrier. As a particular example, the phosphor is carried in a silicone that is dispersed with silver power for desired conductivity. In furtherance of the embodiment, the conductive phosphor carrier material is used to enhance the interconnect between the metal 168 and the n-metal 162 with improved performance and reliability.

In another embodiment as illustrated in FIG. 21, the phosphor is distributed in the third substrate 166, collectively referred to as a phosphor embedded substrate 176. In one example, the third substrate includes a silicone substrate with the phosphor dispersed therein. The phosphor may be uniformly distributed in the silicone substrate. In another example, the silicone substrate 176 may be further processed to form the rough surface 170. In yet another example, the silicone substrate 176 may be further shaped by a suitable technique, such as molding, to form lenses on the outer surface for enhanced emission effect. In another example, the metal layer 168 is embedded in the silicone substrate such that the exposed surface of the metal layer 168 is substantially coplanar with the corresponding surface of the silicone substrate.

By implementing the method 50 and the light-emitting structure 100 in the present disclosure, various advantages and benefits may be present in various embodiments and examples. For example, the LEDs 124 in the large LED array mesa are formed and packaged simultaneously instead of sequentially since LEDs are not individually packaged. The manufacturing cost is reduced and the quality of the LEDs are improved. Thus, the formed light-emitting structure includes a large LED array mesa having multiple LEDs electrically connected in series or at least partially in series for high voltage LED applications. The electrical connection is achieved through the metal pillars 138 and the metal traces (such as 156, 158, and 168) on the second substrate 150 and the third substrate 166. The transparent substrate is used to cap the LEDs 124 of the LED array mesa.

The present disclosure provides a compact vertical multi-junction LED array structure. A double-substrate structure is used for better electrical and optical performances. The metal pillars 138 and the metal traces of the second and third substrate provide electrical interconnection medium and prevent the high voltage breakdown. The method 50 and the light-emitting structure 100 also achieve shorter interconnection distances and smaller packaging form factor. In the present embodiment, the first substrate 102 of sapphire is replaced. The LED array mesa is sandwiched in the double substrates, in which the substrate 166 is transparent. The phosphor is integrated with the transparent substrate either dispersed inside or disposed on the surface.

Although, the light-emitting structure having multiple LEDs integrated in the large LED array mesa and sandwiched in the double substrates and the method of making the same are described according to various embodiments of the present disclosure, other alternatives, replacements, or modifications may be present without departure from the spirit of the present disclosure. In one embodiment, the LEDs in the LED array mesa can include other LEDs than GaN-based LEDs. In another embodiment, the phosphor 172 may include one or more types of luminescent materials for shifting the light into various wavelengths for certain applications. For example, two luminescent materials may be used to generate red and green lights for white illumination applications. In another embodiment, the scribing can be performed after the second and third substrates are attached to the LEDs. Thus the various steps of the method 50 are implemented at wafer level for further reduced the manufacturing cost. In yet another embodiment of the LEDs, the n-GaN layer and the p-GaN layer can be switched without changing the functionality of the light-emitting structure 100.

Thus, the present disclosure provides a light-emitting structure. The light-emitting structure includes a carrier substrate having first metal features; a transparent substrate having second metal features; a plurality of light-emitting diodes (LEDs) bonded with the carrier substrate and the transparent substrate, sandwiched between the carrier substrate and the transparent substrate; and metal pillars bonded to the carrier substrate and the transparent substrate, each of the metal pillars being disposed between adjacent two of the plurality of LEDs, wherein the first metal features, the second metal features and the metal pillars are configured to electrically connect the plurality of LEDs.

In one embodiment of the light-emitting structure, the LEDs have vertical connection including a p-type doped semiconductor layer electrically connected with the first metal features of the carrier substrate; and an n-type doped semiconductor layer electrically connected with the second metal features of the transparent substrate. In another embodiment, each of plurality of the LEDs further includes a highly reflective metal layer disposed on the p-type doped semiconductor layer. In another embodiment, the n-type doped semiconductor layer includes an n-type doped gallium nitride GaN (n-GaN) layer; and the p-type doped semiconductor layer includes a p-type doped gallium nitride (p-GaN) layer. In yet another embodiment, the transparent substrate includes a glass substrate having a rough surface facing away from the plurality of LEDs. In yet another embodiment, the light-emitting structure further includes a phosphor disposed on the rough surface. In yet another embodiment, the phosphor is disposed between the transparent substrate and the plurality of LEDs. In yet another embodiment, the transparent substrate includes a silicone substrate with phosphor dispersed inside. In yet another embodiment, the light-emitting structure further includes a dielectric layer disposed on sidewalls of plurality of the LEDs to protect from leakage.

The present disclosure also provides another embodiment of a method. The method includes forming light-emitting diodes (LEDs) on a first substrate; forming metal pillars on the first substrate, wherein each of the metal pillars is interposed between adjacent two of the LEDs; bonding a second substrate to the LEDs; removing the first substrate; and bonding a transparent substrate to the LEDs such that the LEDs are sandwiched between the second substrate and the transparent substrate.

In one embodiment of the method, the forming of the LEDs includes growing epitaxy layers having an n-type doped semiconductor layer, a multi-quantum well (MQW) and an n-type doped semiconductor layer; and patterning the epitaxy layers to form the LEDs. In another embodiment, the method further includes scribing the first substrate to form a plurality of LED array mesas before the bonding of the second substrate to the LEDs. In yet another embodiment, the forming of the metal pillars includes forming a patterned seed layer on the first substrate; and thereafter performing a plating process to the patterned seed layer, forming the metal pillars. In yet another embodiment, the first substrate is a sapphire substrate, the second substrate is a silicon substrate and the transparent substrate is a glass substrate. In yet another embodiment, the method further includes forming first metal features on the second substrate; and forming second metal features on the transparent substrate such that the first metal features, the second metal features and the metal pillars are configured to electrically connect at least a subset of the LEDs in series. In yet another embodiment, the method further includes disposing a luminescent material in one of configurations: on an outer surface of the transparent substrate; between the transparent substrate and the LEDs; and in the transparent substrate. In yet another embodiment, the bonding of the second substrate and bonding of the transparent substrate utilize eutectic bonding. In yet another embodiment, the method further includes creating a rough surface to the transparent substrate by a process selected from the group consisting of polishing, etching and a combination thereof.

The present disclosure also provides another embodiment of a method. The method includes bonding a plurality of light-emitting diodes (LEDs) on a silicon substrate; and bonding a transparent substrate to the plurality of LEDs such that the plurality of LEDs are sandwiched in the silicon substrate and the transparent substrate, wherein the silicon substrate and the transparent substrate further include first metal features and second metal features, respectively, to electrically connect the plurality of LEDs. In one embodiment, the bonding of the plurality of LEDs includes forming epitaxy semiconductor layers on a sapphire substrate; patterning the epitaxy semiconductor layers to form the plurality of LEDs on the sapphire substrate; and bonding the plurality of LEDs with the sapphire substrate to the silicon substrate. In another embodiment, the method further includes forming metal pillars on the sapphire substrate such that the first metal features, the metal features and the metal pillars are configured to electrically couple at least a subset of the plurality of LEDs in series, after the patterning of the epitaxy semiconductor layers.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A light-emitting structure comprising:
a carrier substrate having first metal features;
a transparent substrate having second metal features;
a plurality of light-emitting diodes (LEDs) bonded with the carrier substrate and the transparent substrate, sandwiched between the carrier substrate and the transparent substrate; and
metal pillars bonded to the carrier substrate and the transparent substrate, each of the metal pillars being disposed between two adjacent LEDs of the plurality of LEDs,
wherein the first metal features, the second metal features, and the metal pillars are configured to electrically connect the plurality of LEDs.

2. The light-emitting structure of claim 1, wherein the LEDs have vertical connection including:
a p-type doped semiconductor layer electrically connected with the first metal features of the carrier substrate; and
an n-type doped semiconductor layer electrically connected with the second metal features of the transparent substrate.

3. The light-emitting structure of claim 2, wherein each of plurality of the LEDs further includes a highly reflective metal layer disposed on the p-type doped semiconductor layer.

4. The light-emitting structure of claim 2, wherein
the n-type doped semiconductor layer includes an n-type doped gallium nitride GaN (n-GaN) layer; and
the p-type doped semiconductor layer includes a p-type doped gallium nitride (p-GaN) layer.

5. The light-emitting structure of claim 1, wherein the transparent substrate includes a glass substrate having a rough surface facing away from the plurality of LEDs.

6. The light-emitting structure of claim 5, further comprising a phosphor disposed on the rough surface.

7. The light-emitting structure of claim 5, further comprising a phosphor disposed between the transparent substrate and the plurality of LEDs.

8. The light-emitting structure of claim 1, wherein the transparent substrate includes a silicone substrate with a phosphor dispersed inside.

9. The light-emitting structure of claim 1, wherein the plurality of LEDs comprises a plurality of subsets, wherein the subsets are connected in parallel and LEDs in a subset are connected in series.

10. A light-emitting structure, comprising:
a carrier substrate, wherein a plurality of first conductive elements are disposed on the carrier substrate;
a transparent substrate, wherein a plurality of second conductive elements are disposed on the transparent substrate;
a plurality of light-emitting diodes (LEDs) disposed between the carrier substrate and the transparent substrate; and a plurality of third conductive elements disposed between the carrier substrate and the transparent substrate, wherein the third conductive elements are each disposed between a different pair of LEDs, respectively, and wherein the LEDs are electrically interconnected together by the first conductive elements, the second conductive elements, and the third conductive elements.

11. The light-emitting structure of claim 10, wherein:
the LEDs each have a first doped semiconductor layer, a second doped semiconductor layer, and a light-emitting layer disposed between the first doped semiconductor layer and the second doped semiconductor layer;
the first doped semiconductor layer is electrically coupled to the first conductive elements;
the second doped layer is electrically coupled to the second conductive elements; and
each third conductive element is electrically coupled between a respective one of the first conductive elements and a respective one of the second conductive elements.

12. The light-emitting structure of claim 10, wherein a respective reflective metal layer is disposed between each first doped layer and the first conductive elements to which it is electrically coupled.

13. The light-emitting structure of claim 10, wherein the transparent substrate includes a glass substrate.

14. The light-emitting structure of claim 13, wherein the glass substrate has a roughened surface facing away from the plurality of LEDs.

15. The light-emitting structure of claim 14, wherein the roughened surface has phosphor disposed thereon.

16. The light-emitting structure of claim 10, further comprising a phosphor material disposed between the transparent substrate and the plurality of LEDs.

17. The light-emitting structure of claim 10, wherein the transparent substrate includes a silicone substrate with phosphor embedded therein.

18. A light-emitting structure, comprising:
a carrier substrate, wherein a plurality of first interconnecting elements are disposed on the carrier substrate;
a transparent substrate, wherein a plurality of second interconnecting elements are disposed on the transparent substrate;
a plurality of light-emitting diodes (LEDs) disposed between the carrier substrate and the transparent substrate, wherein the LEDs each include a first doped semiconductor layer, a second doped semiconductor layer, and multiple-quantum-well disposed between the first doped semiconductor layer and the second doped semiconductor layer, wherein the first doped semiconductor layer is electrically coupled to the first interconnecting elements, and wherein the second doped semiconductor layer is electrically coupled to the second interconnecting elements; and
a plurality of metal pillars disposed between the carrier substrate and the transparent substrate, wherein the metal pillars are disposed between adjacent pairs of LEDs, respectively, and wherein each metal pillar is electrically coupled between a respective one of the first interconnecting elements and a respective one of the second interconnecting elements.

19. The light-emitting structure of claim 18, further comprising a phosphor material, wherein the phosphor material is disposed in one of the following locations:
on a surface of the transparent substrate facing away from the plurality of LEDs;
in between the transparent substrate and the plurality of LEDs; and
embedded within the transparent substrate.

20. The light-emitting structure of claim 18, wherein a surface of the transparent substrate facing away from the plurality of LEDs is roughened.

* * * * *